US006762482B2

(12) United States Patent
Liu et al.

(10) Patent No.: US 6,762,482 B2
(45) Date of Patent: Jul. 13, 2004

(54) MEMORY DEVICE WITH COMPOSITE CONTACT PLUG AND METHOD FOR MANUFACTURING THE SAME

(75) Inventors: Wen-Chung Liu, Banchiau (TW); Bor-Ru Sheu, Hsinchu (TW); Yoshiaki Fukuzumi, Kawasaki (JP)

(73) Assignees: Winbond Electronics Corporation, Hsinchu (TW); Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/336,956

(22) Filed: Jan. 6, 2003

(65) Prior Publication Data

US 2003/0127708 A1 Jul. 10, 2003

(30) Foreign Application Priority Data

Jan. 10, 2002 (TW) ........................................ 91100227 A

(51) Int. Cl.⁷ .............................................. H01L 29/93
(52) U.S. Cl. ........................................ 257/602; 257/516
(58) Field of Search ................................ 257/295, 296, 257/300, 774; 438/393, 253, 678; 361/321.4

(56) References Cited

U.S. PATENT DOCUMENTS 5,313,089 A * 5/1994 Jones, Jr. ..................... 257/295
6,235,603 B1 * 5/2001 Melnick et al. ............. 438/393

* cited by examiner

Primary Examiner—David Nelms
Assistant Examiner—Thinh T. Nguyen
(74) Attorney, Agent, or Firm—Birch, Stewart, Kolasch & Birch, LLP

(57) ABSTRACT

A memory device with composite contact plug and method for manufacturing the same. The composite contact plug comprises a first insulating layer deposited on a semiconductor substrate. A contact hole is formed to penetrate through the first insulation layer. A barrier layer is deposited in the contact hole and fills a portion of the contact hole. A contact plug is formed on the barrier layer and fills the contact hole. The first insulating layer is etched back until the surface of the first insulating layer is below the contact plug. A diffusion barrier layer is then deposited on the first insulating layer and the contact plug. The diffusion barrier layer is planarized until the contact plug is exposed to form a composite contact plug. The memory device is constructed on the composite contact plug.

15 Claims, 7 Drawing Sheets

MEMORY DEVICE WITH COMPOSITE CONTACT PLUG AND METHOD FOR MANUFACTURING THE SAME

Pursuant to 35 U.S.C. §119(a)–(d), this application claims priority from Taiwanese application no. 091100227, filed on Jan. 10, 2002.

FIELD OF THE INVENTION

The present invention relates to semiconductor manufacture, and more particularly to a memory device with composite contact plug and a method for manufacturing the same.

BACKGROUND OF THE INVENTION

The contact between the capacitor storage node and cell device is critical in the integration of ferroelectric or high dielectric constant perovskite material in semiconductor memory devices. The electrode materials (such as Pt, Ru, Ir and conducting metal oxides) for capacitor storage node are generally used in combination with suitable barriers that block diffusion of the elements in the high dielectric constant films or in Si devices to prevent interaction between the components. Moreover, there are difficulties raised during process integration of high dielectric constant capacitors due to the fact that these electrode materials require a certain barrier layer at the interface with the poly-si plug, which connects the capacitor with the transistor. Generally, binary and ternary refractory metal nitrides (such as TiN, TiSiN, TaSiN, or TiAlN) are chosen to protect the storage electrode from reacting with Si during the high dielectric constant film deposition, high temperature annealing or insulating layer deposition, and to keep good electrical conductivity of the barrier after these process. However, simple stacks of barrier/electrode are prone to be oxidization during ferroelectric material deposition because of the exposure of the sidewall area to the oxidating atmosphere.

Metallic plugs improve the electrical conductivity of the contact plug, and therefore, there are various storage node electrode contact designs in high dielectric capacitors comprising metallic plugs, such as metal plug/TaAlN/SrRuO$_3$ Ru-plug/SrRuO$_3$/BST/SrRuO$_3$ metal plug/Ru/Ta$_2$O$_5$/Ru and Ru-plug/Ru/Ta$_2$O$_5$/Ru.

Ru is a contact plug metal in the prior art. Recent studies (for example, reports in J. Electrochem. Soc. 146, 4189, 1999 and JJAP 37, L242, 1998) have disclosed that the Ru/poly-Si interface shows thermal stability by suppressing silicidation of Ru under appropriate conditions during Ru deposition. Therefore, the Ru plug prevents the deterioration between the metal plug and the underlying poly-Si plug or Si device if there is no intermediate layer between. As well, when conductive metal oxides are selected as electrode materials, the RuO$_2$ layer generated after high temperature process will not degrade the total capacitance of integrated ferroelectric or high dielectric constant capacitor, but the Al-rich oxide layer ,such as TiAlN barrier, will. Moreover, when Ru is selected as the material for a storage node capacitor, the same Ru plug as Ru storage node may improve the adhesion problems associated with other plug metals and reduces process steps and cost.

The transistor characteristics are degraded because of the contamination of metallic plug/electrode or elements of perovskite metal oxide electrode. One purpose of the barrier layer, such as TiN/Ti or SiN, is to shield metal contamination. However, viewing from the bit line direction in FIG. 1, metallic or metal oxide storage node 18 contacts the underlying insulating layer 12 directly (as arrow A shows) and there is no barrier layer between. Metal contamination diffuses through the oxide layer. Moreover, the interface at which barrier layer 16 contacts storage electrode 18 (as arrow B shows) is the weak point for leakage and reliability and easily oxidized during the deposition of high dielectric film and high temperature annealing process. The oxidation raises the contact resistance. Furthermore, because of the relevant feature size of 0.3 μm and beyond, high aspect ratio contact hole makes it difficult to fill gaps of CVD plug Ru.

Therefore, there is a need to improve the interface between the storage electrode and the contact plug in a memory device.

SUMMARY OF THE INVENTION

One object of the present invention provides a memory device with composite contact plug and a method for manufacturing the same to avoid barrier layer oxidation.

Another object of the present invention provides a memory device with composite contact plug and method for manufacturing the same to avoid metal contamination caused by storage electrode in contact with dielectric layer.

Still another object of the present invention provides a memory device with composite contact plug and method for manufacturing the same to fill gap of metal plug in high aspect ratio contact hole.

The invention achieves the above-identified objects by etching back the barrier layer to the surface below the contact hole before metal plug (such as Ru plug) deposition. The recessed barrier layer prevents the capacitor dielectric layer form oxidization during deposition or in the following thermal process. The leakage and unreliable properties caused by the barrier layer in contact with storage electrode are then solved.

The invention achieves the above-identified objects by filling about half of the contact hole in depth with barrier layer to reduce aspect ratio and make it easier to form the metal plug.

The invention achieves the above-identified objects by forming a diffusion barrier layer between the storage electrode and the insulating layer beneath to prevent metal contamination from the quality reduction of transistor.

BRIEF DESCRIPTION OF THE DRAWINGS

The present invention will become more fully understood from the detailed description given herein below and the accompanying drawings, given by way of illustration only and thus not intended to be limitative of the present invention. In the drawings.

DETAILED DESCRIPTION OF THE INVENTION

FIGS. 2A through 2G are schematic cross-sections illustrating the process for manufacturing a memory device according to the first embodiment in the present invention.

Figure 1:
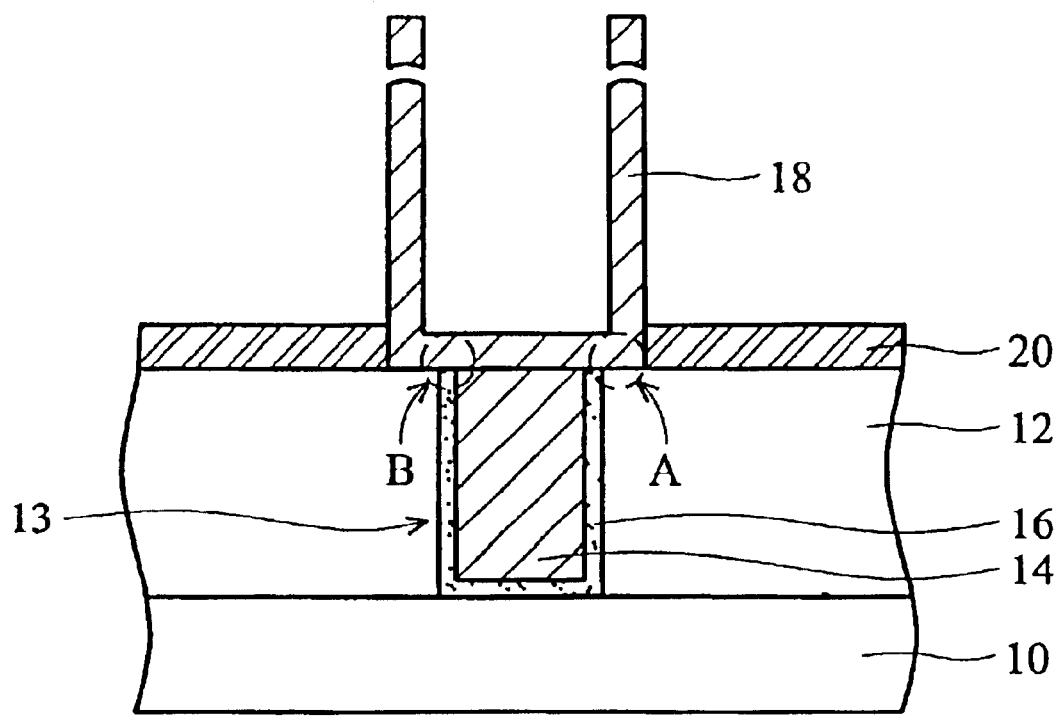
FIG. 1 is a schematic view of a conventional structure showing a barrier layer of binary or ternary refractory metal nitride between storage electrode and contact plug.
Figure 2A:
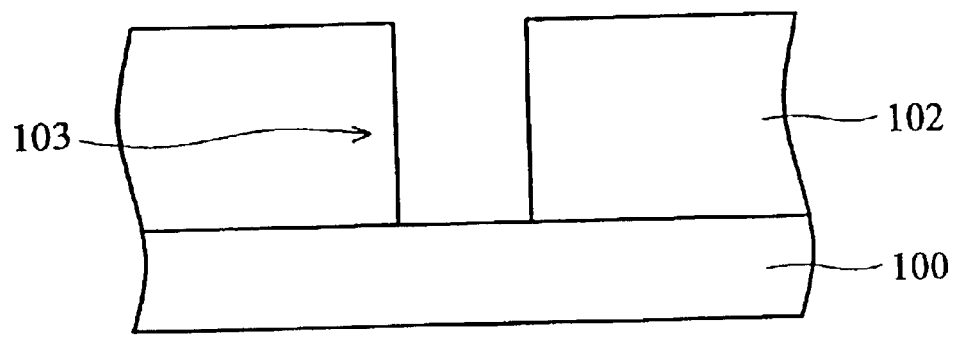
FIGS. 2A through 2G are schematic cross-sections illustrating the process for manufacturing a memory device in the first embodiment according to the present invention.

In the following description, "substrate" represents a semiconductor wafer with predetermined device and/or film thereon; "surface of the substrate" represents the exposing surface of the wafer, such as a surface layer, insulating layer or metal layout on the wafer. As shown in FIG. 2A, the initial step provides a semiconductor substrate 100 with a first insulating layer 102, e.g. 200~1000 nm silicon oxide, thereon. A contact hole 103 with diameter 0.1~0.2 µm is defined by lithography and etching on the first insulating layer 102. There can be MOS device, bit line, logic device or poly-silicon plug on the semiconductor substrate 100 if needed, though they are not shown in the figures.

Figure 2B:
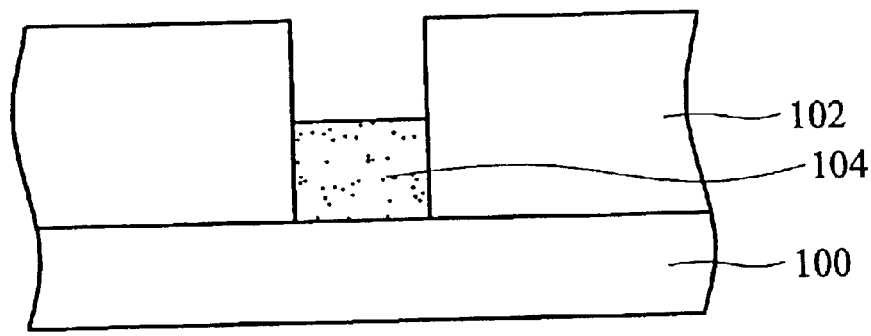

FIG. 2B shows a key step according to the present invention. A barrier layer 104 is deposited on the contact hole 103 such as TiN/Ti and then etched back by dry or wet etching to the surface of the barrier layer 104 below the first insulating layer 100~500 nm in depth. In a preferred embodiment, half of the contact hole 103 is filled in depth with the barrier layer. For example, if the thickness of first insulating layer 102 is 200~1000 nm, the thickness of the barrier layer is about 100~500 nm.

Figure 2C:
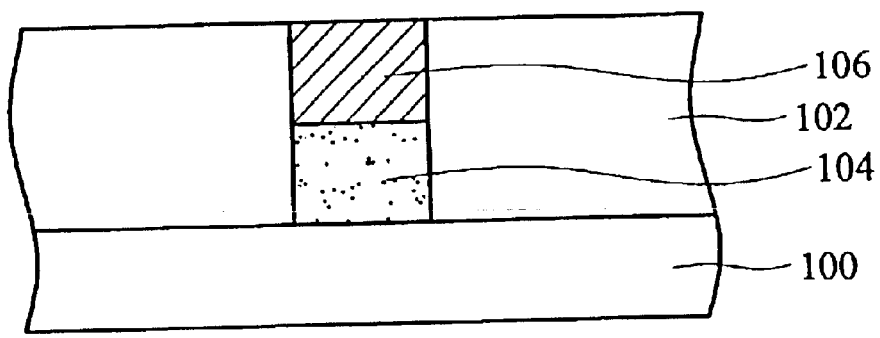

A layer of metal, e.g. Ru, is then deposited on the surface of the substrate and fills the contact hole 103. A metal plug 106 as shown in FIG. 2C is formed by removing excess metal layer on the first insulating layer 102 with Chemical Mechanical Polishing (CMP) or Reactive Ion Etching (RIE). FIG. 2C shows that the contact hole 103 has been padded by the barrier layer 104 beneath before Ru deposition and therefore it improves metal plug deposition.

Figure 2D:
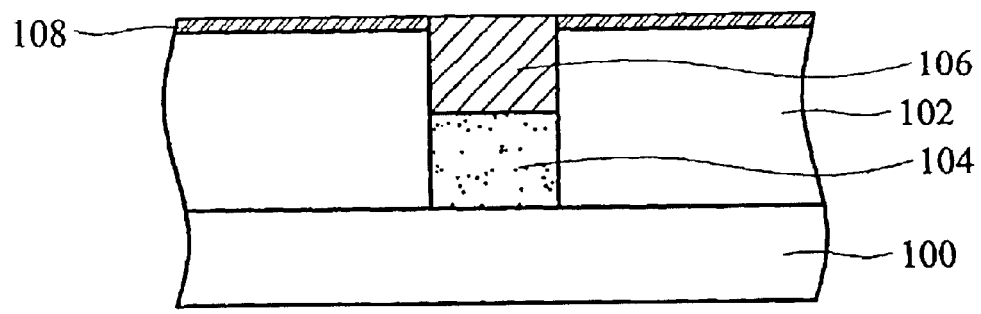

FIG. 2D shows the result of another key step according to the present invention. A diffusion barrier layer 108, e.g. 10~50 nm silicon nitride, is formed on the first insulating layer 102. To achieve this, the first insulating layer 102 is etched back 10~50 nm by wet or dry etching. A diffusion barrier layer 108 is deposited on the first insulating layer 102 and the contact plug 106 and followed by Chemical Mechanical Polishing (CMP) for planarization until the contact plug 106 is exposed as shown in FIG. 2D.

A composite plug structure is obtained in the first embodiment of the present invention, comprising: a first insulating layer 102; a diffusion barrier layer 108 on the insulating layer 102; a barrier layer 104 filling a portion of a contact hole 103; and a contact plug 106 on the barrier layer 104 and filling the contact hole 103. A memory device can be constructed by fabricating a capacitor on the composite plug structure. In the following description, a cylindrical capacitor is used to illustrate the process of memory device fabrication according to the present invention. However, the present invention can also be applied to other types of capacitor, such as a concave capacitor.

Figure 2E:
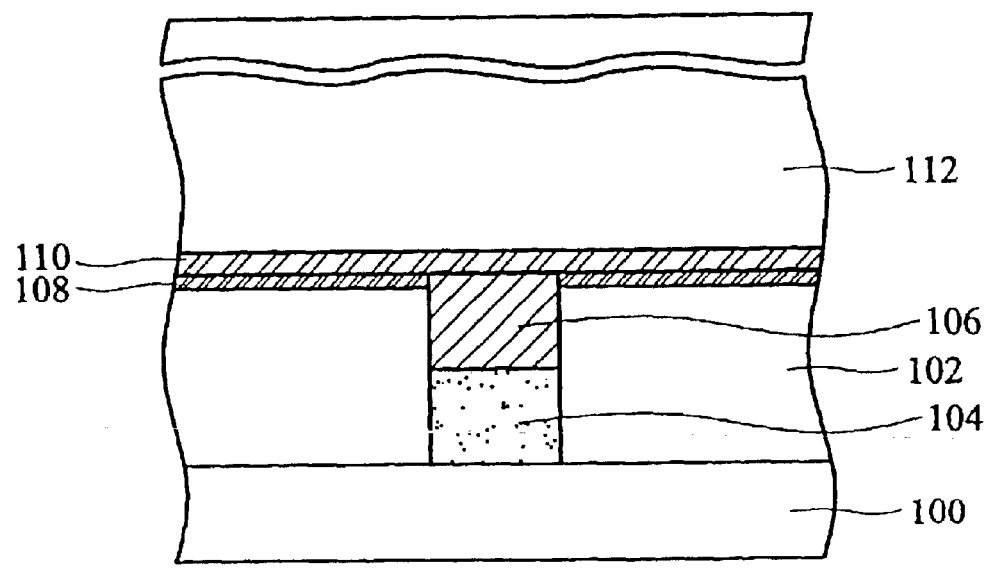

A second insulating layer 110 and third insulating layer 112 are formed in sequence on the structure as shown in FIG. 2E. The second insulating layer 110 is applied as an etching-stopped layer and the material is, for example, silicon nitride or oxynitride with a thickness about 10~100 nm. The third insulating layer 112 can be silicon oxide with a thickness about 300~1000 nm.

A opening 113 is formed by lithography and etching to remove the undesired second and third insulating layers 110 and 112 and expose the contact plug 106. The diameter of the opening 113 is 0.1~0.2 µm and the tilting angle inside the opening 113 is about 80~90°. A conductive layer 114 is deposited on the third insulating layer 112 and opening 113. The material of the conductive layer 114 can be noble metals, such as Pt Ir or Ru, conductive metal oxides, such as $IrO_2$ or $RuO_2$, or peorvskite metal oxides, such as $SrRuO_3$.

Figure 2F:
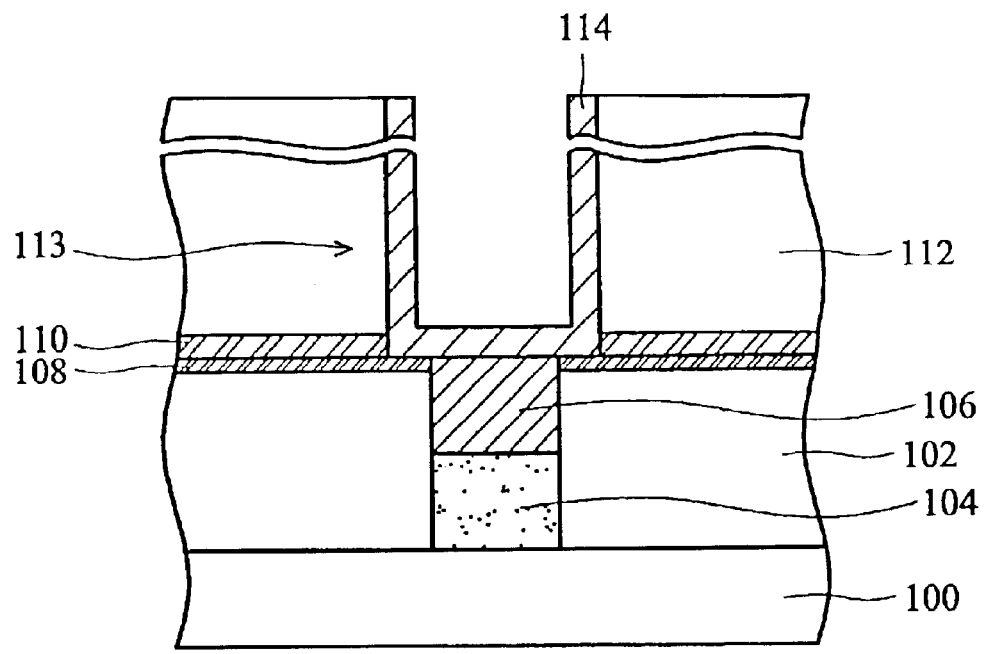

The excess metal is removed by chemical mechanical polishing and a lower cylindrical electrode 114 is formed as FIG. 2F shows.

Figure 2G:
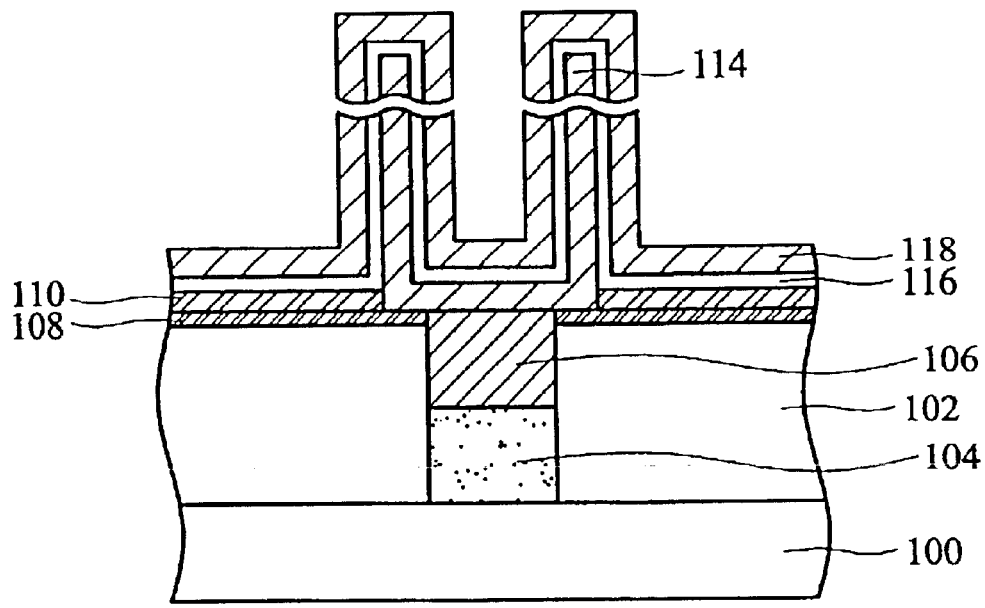

The third insulating layer 112 is etched back by wet or dry etching to the second insulating layer to expose the outer surface of the lower cylindrical electrode 114. A cylindrical capacitor is completed as shown in FIG. 2G by depositing a conformal dielectric layer 116 and a conformal upper electrode layer 118. The thickness of the dielectric layer 116 is about 5~40 nm and the material can be lead zirconate titanate (PZT), strontium bismuth tantalate (SBT), $BaSrTiO_3$ (BST) or $SrTiO_3$ (ST). The thickness of the upper electrode layer 118 is about 20–100 nm and the material can be noble metals, such as Pt, Ir or Ru, or metal oxides, such as $SrRuO_3$ $IrO_2$ or $RuO_2$.

As FIG. 2G shows, the barrier layer 104 has been separated from the top of the contact hole to prevent oxidation during the dielectric layer 116 deposition. The weak point of leakage and reliability caused by the barrier layer in contact with the storage electrode can be avoided. Furthermore, the diffusion of metal contaminate is also avoided by separating the lower electrode 114 and the first insulating layer 102 with a diffusion barrier layer 108.

FIGS. 3A through 3F are schematic cross-sections illustrating the process for manufacturing a memory device in the second embodiment according to the present invention. The same numbers denote like structures and the analogical structures are denoted as the same number with an "a".

Figure 3A:
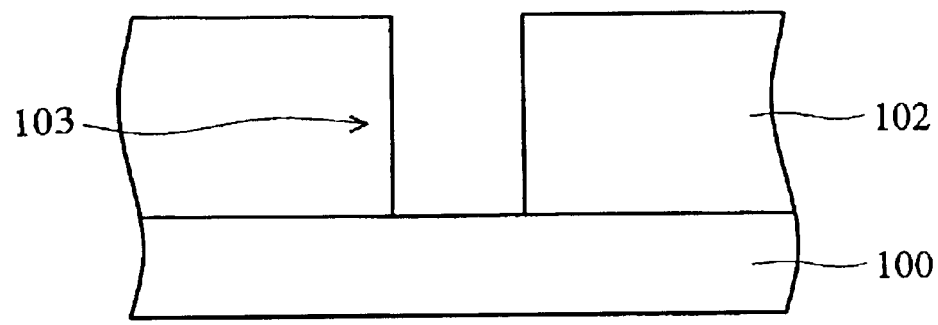
FIGS. 3A through 3F are schematic cross-sections illustrating the process for manufacturing a memory device in the second embodiment according to the present invention.

As shown in FIG. 3A, a semiconductor substrate 100 is provided with a first insulating layer, e.g. 200~1000 nm silicon oxide, thereon. A contact hole 103 with diameter 0.1~0.2 µm is defined by lithography and etching on the first insulating layer 102.

Figure 3B:
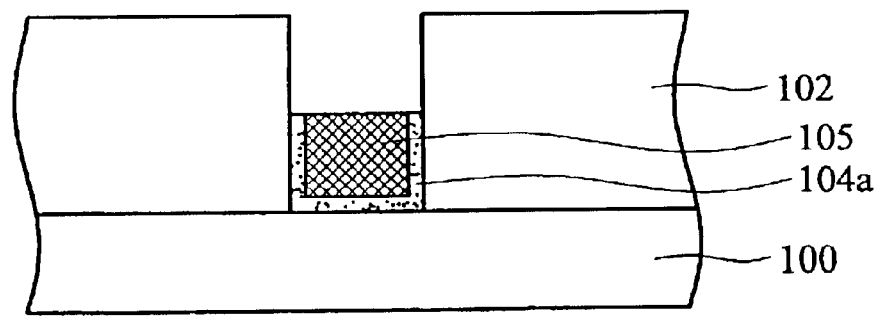

FIG. 3B shows a key step according to the present invention. A conformal barrier layer 104a, e.g. TiN/Ti in the thickness of 10~50 nm, is deposited in the contact hole 103. The contact hole 103 then is filled with a conductive layer 105, e.g. W. The barrier layer 104a and conductive layer 105 are etched back by dry or wet etching to form a first contact plug 105. In a preferred embodiment, half of the contact hole 103 is filled with the first contact plug 105 in depth. For example, if the thickness of first insulating layer 102 is 200~1000 nm, the thickness of the first contact plug 105 is about 100~500 nm.

Figure 3C:
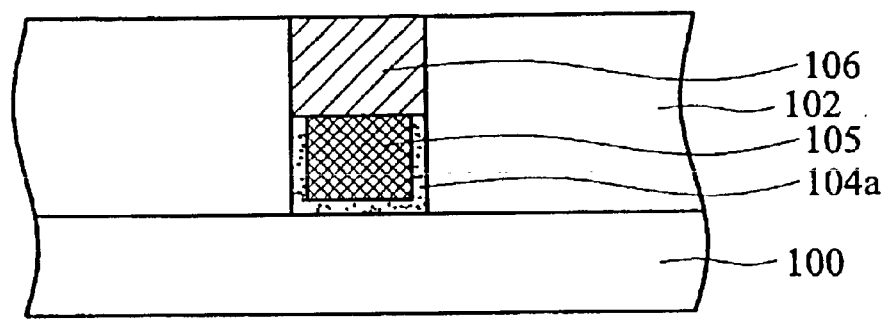

A layer of metal, e.g. Ru, is deposited on the surface of the substrate and fills the contact hole 103. A second metal plug 106 as shown in FIG. 3C is formed by removing excess metal layer on the first insulating layer 102 with chemical mechanical polishing or reactive ion etching. FIG. 3C shows that the contact hole 103 has been padded by the underlying first contact plug 105 before Ru deposition and therefore it improves metal plug deposition.

Figure 3D:
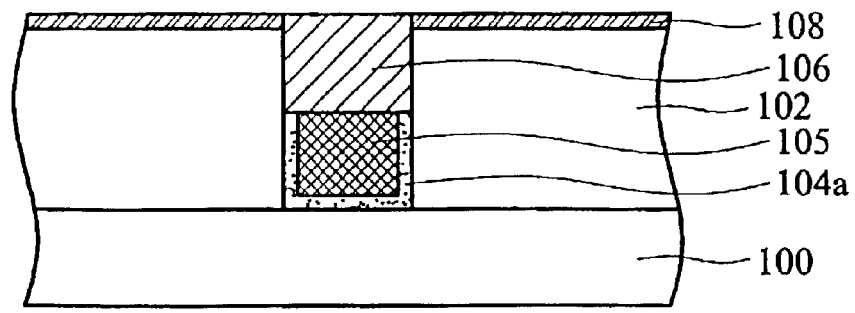

FIG. 3D shows the result of another key step according to the present invention. A diffusion barrier layer 108, e.g. 10~50 nm silicon nitride, is formed on the first insulating layer 102. To achieve this, the first insulating layer is etched back 10~50 nm by wet or dry etchinG. A diffusion barrier layer 108 is deposited on the first insulating layer 102 and the second contact plug 106 and followed by chemical mechanical polishing for planarization until the contact plug 106 is exposed as shown in FIG. 3D.

A composite plug structure is obtained in the second embodiment of the present invention, comprising: a first insulating layer 102; a diffusion barrier layer 108 on the insulating layer 102; a contact hole 103 penetrating the first insulating layer 102 and the diffusion barrier layer 108; a barrier layer 104 lining inside the lower portion and bottom of the contact hole 103; and a first contact plug 105 on the barrier layer and filling a portion of the contact hole; and a second contact plug 106 on the first contact hole 105 and filling the contact hole 103.

Figure 3E:
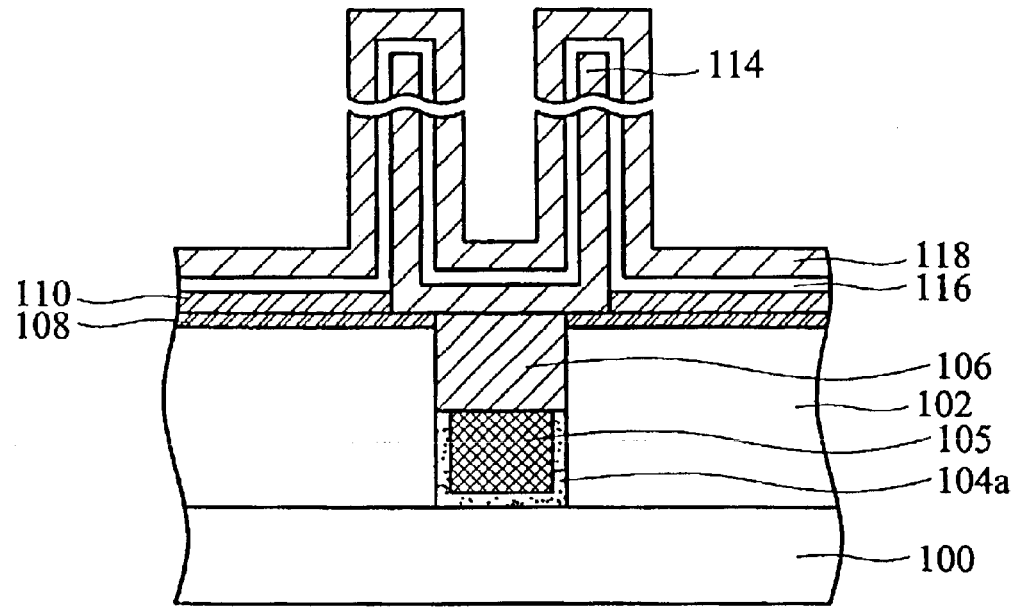
Figure 3F:
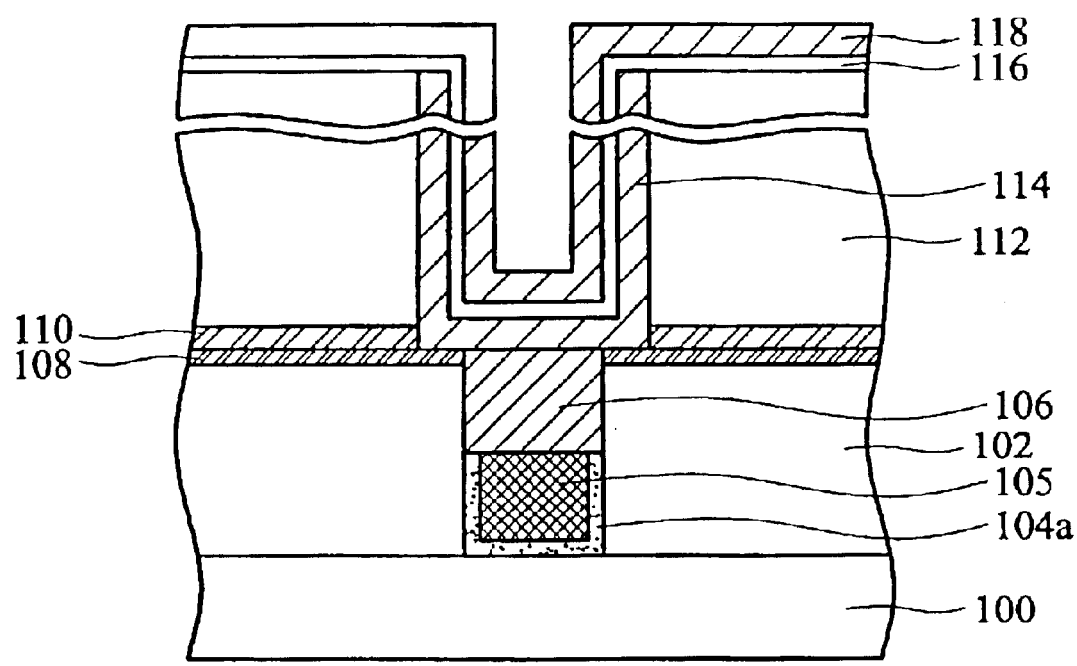

A cylindrical capacitor can be formed on the structure showing in FIG. 3D by following the steps as shown in FIGS. 2E~2G. As well, a concave capacitor as shown in FIG. 3E can also be formed by modified steps according to the present invention.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A memory device with composite contact plug, comprising:
   a first insulating layer;
   a diffusion barrier layer over the first insulating layer;
   a contact hole penetrating through the diffusion barrier layer and the first insulating layer;
   a barrier layer inside the contact hole and filling a portion of the contact hole;
   a contact plug on the barrier layer and filling the contact hole; and
   a capacitor on the barrier layer and contacting with the contact plug.

2. The memory device as claimed in claim 1, wherein the diffusion barrier layer is silicon nitride.

3. The memory device as claimed in claim 1, wherein the barrier layer is Ti/TiN.

4. The memory device as claimed in claim 1, wherein the contact hole is half filled with the barrier layer in depth.

5. The memory device as claimed in claim 1, wherein the contact plug is a Ru plug.

6. The memory device as claimed in claim 1, wherein the capacitor is a cylindrical capacitor.

7. The memory device as claimed in claim 1, wherein the capacitor is a concave capacitor.

8. A memory device with composite contact plug, comprising:
   a first insulating layer;
   a diffusion barrier layer over the first insulating layer;
   a contact hole penetrating through the diffusion barrier layer and the first insulating layer;
   a barrier layer lining inside the lower portion and bottom of the contact hole;
   a first contact plug on the barrier layer and filling a portion of the contact hole;
   a second contact plug on the first contact plug and filling the contact hole; and
   a capacitor on the barrier layer and contacting the second contact plug.

9. The memory device as claimed in claim 8, wherein the diffusion barrier layer is silicon nitride.

10. The memory device as claimed in claim 8, wherein the barrier layer is Ti/TiN.

11. The memory device as claimed in claim 8, wherein the first contact plug is a W plug.

12. The memory device as claimed in claim 8, wherein the contact hole is half filled with the first contact plug in depth.

13. The memory device as claimed in claim 8, wherein the second contact plug is a Ru plug.

14. The memory device as claimed in claim 8, wherein the capacitor is a cylindrical capacitor.

15. The memory device as claimed in claim 8, wherein the capacitor is a concave capacitor.

* * * * *